United States Patent [19]

Benner et al.

[11] 3,840,755

[45] Oct. 8, 1974

[54] CIRCUIT ARRANGEMENT INCLUDING A HIGH VOLTAGE TRANSISTOR

[75] Inventors: Günter Benner, Halstenbeck; Günther Stacker, Hamburg, both of Germany

[73] Assignee: U.S. Philips Corporation, New York, N.Y.

[22] Filed: Oct. 13, 1972

[21] Appl. No.: 297,188

[30] Foreign Application Priority Data

Oct. 16, 1971 Germany .......... 2151610
Apr. 12, 1972 Germany .......... 2217451

[52] U.S. Cl. .......... 307/260, 307/254, 307/300
[51] Int. Cl. .......... H03k 17/00
[58] Field of Search .......... 307/254, 300, 260; 315/27; 321/DIG. 1

[56] References Cited

UNITED STATES PATENTS

| | | | |
|---|---|---|---|
| 2,933,642 | 4/1960 | Marley | 307/300 X |
| 3,129,354 | 4/1964 | Hellstrom | 307/254 |
| 3,546,492 | 12/1970 | Barchok | 307/300 |
| 3,569,742 | 3/1971 | Schroeder | 307/300 |
| 3,688,153 | 8/1972 | Wheatley, Jr. | 307/300 |

*Primary Examiner*—Rudolph V. Rolinec
*Assistant Examiner*—B. P. Davis
*Attorney, Agent, or Firm*—Frank R. Trifari; Bernard Franzblau

[57] ABSTRACT

The dissipation and the associated thermal load on the transistor occurring during inverse operation of a high voltage power transistor at the emitter base diode, for example, in a horizontal deflection output stage is substantially prevented by a diode which is arranged anti-parallel with the base emitter diode of the transistor. The diode must have a switching delay of at least 1 μs in order that the switching off of the transistor is not perturbed. The switching delay is obtained by impedances arranged in series with the diode. The impedances may consist of saturable or non-saturable coils or of a transistor.

17 Claims, 3 Drawing Figures

CIRCUIT ARRANGEMENT INCLUDING A HIGH VOLTAGE TRANSISTOR

Figure 1:
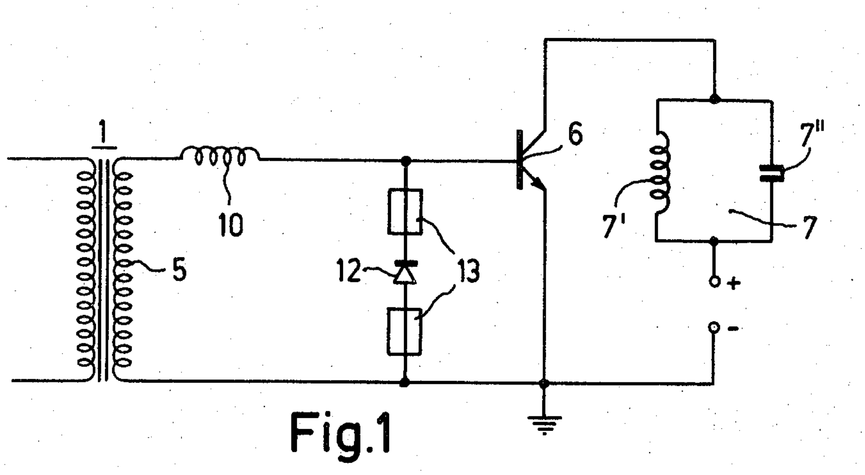

The invention relates to a circuit arrangement including a high voltage transistor, particularly a power transistor, having drive means providing a pulsatory switching signal between the base and emitter electrodes of the transistor, and a load impedance connected to the collector electrode of the transistor, the collector current of the bottomed transistor provided by a voltage source being interrupted under the influence of the pulsatory switching signal applied to the transistor, a diode being provided between the base and the emitter electrode of the transistor, the conductivity direction of said diode being opposite to that of the base emitter junction of the transistor.

An arrangement of this kind is known from U.S. Pat. No. 3,757,144. For the operation of this arrangement it is of significant importance that the said diode, when being fed with a voltage rendering it conducting, must change over to the conducting state only after a delay time of at least approximately 1 $\mu$s. This is achieved with specially dosed diodes. In case of higher frequencies, as when using line output circuits, this delay time is in fact to be considered as considerable.

An object of the present invention is to be independent of these special diodes and yet to ensure a delayed switching of conventional diodes in a simple manner with a minimum delay time being selectable.

To this end the invention is characterized in that at least one impedance is arranged in series with the diode by which the diode is brought to the conducting state with a delay time of at least approximately 1 $\mu$s.

The invention will hereinafter be described, by way of example, with the reference to the accompanying FIGS. 1, 2 and 3 of the drawing which show embodiments of the arrangement according to the invention.

In FIG. 1 a square-wave signal provided by an oscillator (not shown) is applied through a driver transformer 1 to the base of an output transistor 6 of the npn-conductivity type which is part of a sawtooth generator, for example, a horizontal deflection generator in television display apparatus (not shown) and the negative voltage part of this signal brings transistor 6 to the non-conducting state when the flyback period is initiated. The emitter of transistor 6 is connected to ground or is connected to the negative terminal of a direct voltage source. A cosine half oscillation occurs during the flyback period in the deflection circuit 7, which consists in principle of the deflection coil 7′ and the capacitor 7′′ and which is connected to the collector of transistor 6 at one end and to a positive direct voltage source at the other end. As a result, a negative voltage is present at the collector of transistor 6 in the first half of the subsequently initiated scan period. The collector-base diode of transistor 6 conducts, i.e., the transistor operates inversely during the first half of the scan period. Since furthermore the negative cut-off voltage of approximately 7 V with respect to the emitter voltage is present at the base of transistor 6, a high dissipation is produced in the base-emitter diode, which also thermally loads transistor 6 to a large extent. This dissipation is obviated in that a diode 12 is arranged anti-parallel with the base-emitter diode of transistor 6, which diode reduces the voltage at the base-emitter diode from −7 volts to approximately −1 volt during inverse operation.

Since conventional diodes have only a slight delay time when switching over from the non-conducting to the conducting state, diode 12 would transfer the negative switching voltage to the base of transistor 6 before the end of the switching-off operation so that the switching-off operation for transistor 6 would be disturbed. Synchronisation perturbations and drop-out of the output transistor would be the result. Consequently it must be ensured that diode 12 acquires its conducting state with a delay of at least approximately 1 $\mu$s. This was achieved with special dosed diodes.

According to the invention the switch-over time of a conventional diode in FIG. 1 is delayed with certainty in that inductors 13 are arranged in series with this diode, which may be particularly obtained in a very simple manner by securing ferrite beads to one or both of the supply wires of the diode 12. Specially dosed diodes which must have a minimum delay time can therefore be omitted. The ferrite beads used for this purpose, according to the invention, have the additional advantage of limiting to lower values the high frequency peak currents produced during the switching process of the diode.

When an inductor 10 is arranged in the base circuit of output transistor 6, the base current increases relatively slowly when the flyback period is initiated so that the excess charge carriers in the collector-base junction of transistor 6 are depleted quickly and with low loss via the collector-emitter circuit. Furthermore a more negative switching voltage may be produced at the base of transistor 6 so that this also accelerates the switching off of the transistor. The improved switching operation provided by inductor 10 is described in detail in U.S. Pat. No. 3,631,314. The advantages of the embodiment of this circuit are, however, only present when diode 12 switches with a delay of approximately 1.5 to 2$\mu$s, which can be simply and certainly obtained with ferrite beads secured to the supply wires for diode 12.

By proper selection of the number of ferrite beads and/or their length and material composition, the minimum delay time may be selected in a simple manner.

During the first half of the scan period of the deflection cycle there flows, however, a relatively large current, the so-called inverse current, via the collector-base path of transistor 6 and diode 12 to the negative terminal of the supply source. As the inductor 13 must have a relatively large resistance during the switching-off process, the current must increase very quickly during inverse operation when a relatively high voltage is present between the collector of the output transistor 6 and ground, in order that linearity errors are prevented during deflection. It is possible that ferrite beads or air-core coils represent an extra impedance which cannot be quite neglected because they substantially maintain their inductance also when the inverse current flows, so that small linearity errors may occur.

Figure 2:
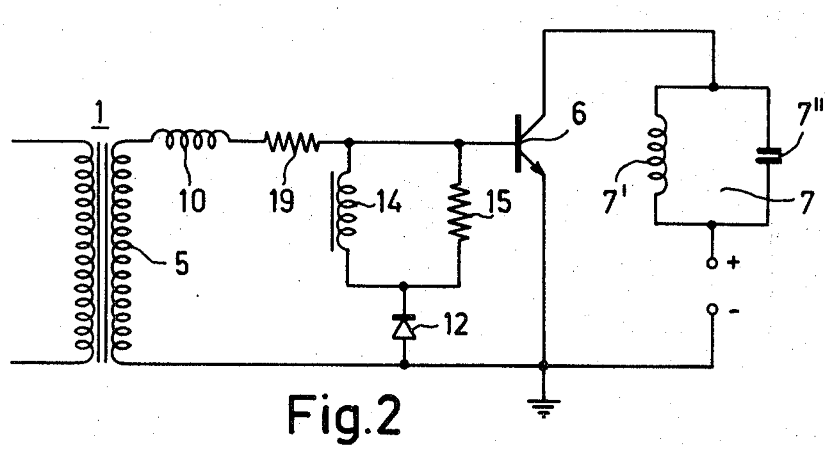
Figure 3:
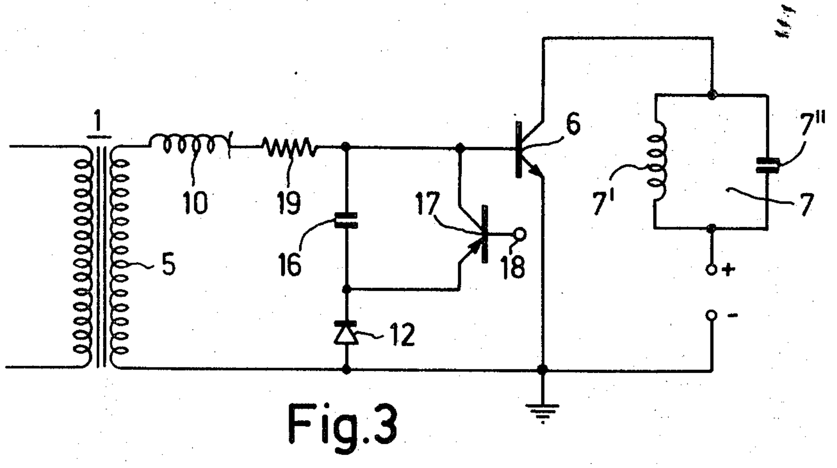

The embodiments accordibg to FIGS. 2 and 3 provide an improvement in this respect. In FIG. 2 a saturable coil 14 is provided instead of the ferrite beads 13. During the switch-off period a relatively low switch-off voltage is present at the base of transistor 6 and a relatively low current flows through coil 14 so that it is still far away from its saturation state and thus its inductance is relatively large. The current through diode 12 therefore increases relatively slowly and thus increases the switching time of diode 12. In the case of inverse operation of transistor 6, a relatively large inverse current flows via coil 14 and diode 12. As compared with the diode current originating from the switch-off current, the inverse current is larger by at least a factor of two times. It causes a coarse saturation of coil 14 so that its inductance and hence its impedance drops to a low value and thus represents substantially only a small ohmic resistance for the inverse current and the inverse current can substantially increase linearly.

For this embodiment a choke coil having three turns has been found to be advantageous. The resistor 15 (for example, approximately 10 Ohms) and connected in parallel thereacross and the resistor 19 (for example, approximately 1 Ohm) arranged in series with coil 10 serve for damping inadmissible parasitic oscillations.

In FIG. 3 the parallel arrangement of a capacitor 16 and a pnp-transistor 17 is arranged in series with the diode 12 while the emitter of the transistor is connected to the cathode of diode 12 and the collector is connected to the base of transistor 6. This transistor 17 is brought to the non-conducting state during the switching-off of transistor 6 through a terminal 18 by means of a suitable switching voltage which may be derived, for example, from an additional winding on the output transformer so that transistor 17 has a very large resistance during this period. During inverse operation of the transistor 6, thus when the inverse current flows, transistor 17 conducts and presents a very small resistance for the inverse current so that no linearity error an occur. The capacitor 16 connected in parallel with the emitter-collector path of transistor 17 is provided for damping parasitic oscillations. Since the diode 12 is arranged in series with the collector-emitter path of transistor 17 and since the pass direction is the same, diode 12 may alternatively be omitted.

Finally, cooling fins may be provided on the supply wires for the diode which conduct away the heat evolved in the diode.

What is claimed is:

1. A circuit for switching a high voltage transistor between a saturation condition and a cut off condition comprising, drive means coupled to the transistor input circuit to provide a pulsatory switching signal between the base electrode and the emitter electrode of the transistor of a magnitude and polarity to drive the transistor from saturation into cut off, a load impedance connected to the collector electrode of the transistor, a diode connected between the base electrode and the emitter electrode of the transistor with the conductivity direction of said diode being opposite to that of the base emitter junction of the transistor, and at least one impedance connected in series with the diode across the transistor base-emitter junction to provide a delay time of at least one microsecond whereby the turn-on time of said diode is delayed at least one microsecond upon the application of said pulsatory switching signal.

2. A circuit as claimed in claim 1; wherein said one impedance includes at least one inductor for delaying the switching instant of the diode.

3. A circuit as claimed in claim 2 wherein said one inductor comprises ferrite beads provided on at least one connection wire to the diode.

4. A circuit as claimed in claim 1, wherein said load impedance includes inductor means which, in conjunction with said pulsatory switching signal, produce an inverse current flow through the transistor base-collector junction during a portion of the transistor operation cycle, and characterized in that the one impedance exhibits a large impedance value upon the occurrence of the pulsatory switching signal at the base of the transistor and exhibits a low impedance value during the occurrence of said inverse current through the collector base path of the transistor during inverse operation of said transistor.

5. A circuit as claimed in claim 4, characterized in that the one impedance comprises a saturable reactor which has a large inductance during the occurrence of the pulsatory switching signal at the base of the transistor and a low inductance during the occurrence of the inverse current through the collector base path of said transistor.

6. A circuit as claimed in claim 5, further comprising a resistor connected in parallel with the saturable reactor.

7. A circuit as claimed in claim 4, characterized in that the one impedance comprises a second transistor whose collector emitter path is connected in series with the diode with the same conductivity direction as the diode, and means for driving said second transistor so that it is cut off when the pulsatory switching signal occurs and is conducting when the inverse current flows through the collector base path during inverse operation of the high voltage transistor.

8. A circuit as claimed in claim 4, characterized in that the diode comprises the emitter base diode junction of a second transistor and the impedance comprises the collector base diode thereof, and means for driving said second transistor so that it is cut off when the pulsatory switching signal occurs and is conducting when the inverse current flows through the collector base path during inverse operation of the high voltage transistor.

9. A circuit as claimed in claim 1 further comprising inductor means connected in series circuit with said switching signal applying means and the base-emitter junction of the transistor for limiting the variation in reverse base current flow when the switching signal drives the transistor into cut-off.

10. A circuit as claimed in claim 1 wherein said load impedance comprises a coil.

11. A switching circuit for producing a sawtooth current in a load comprising, a transistor with its collector connected to said load, means for applying a switching signal between the base and emitter electrodes of the transistor of a magnitude and polarity to alternately turn the transistor on and off, a diode, an impedance element providing a delay time of at least 1 microsecond, and means connecting the diode and the impedance element in series across the transistor base and emitter electrodes and with the current conductivity direction of the diode opposite to that of the transistor base-emitter junction whereby the turn-on time of the diode is at least one microsecond in response to a switching signal of a polarity that tends to drive the transistor into cutoff.

12. A switching circuit as claimed in claim 11 wherein said load is arranged to develop a voltage of an amplitude and polarity to cause a reverse current to flow through said load and the transistor base-collector junction via said diode during a portion of the transistor operating cycle when said switching signal cuts off the transistor, and a source of DC voltage coupled to the collector of the transistor.

13. A switching circuit as claimed in claim 11 wherein said impedance element comprises a saturable reactor that is driven into saturation during a portion of the transistor operating cycle when said switching signal cuts off the transistor.

14. A switching circuit as claimed in claim 11 wherein said impedance element comprises a second transistor connected in series with the diode and polarized to pass current in the same direction as the diode, and means for applying a cut-off control signal to the control electrode of the second transistor in synchronism with the switching signal so that the second transistor is cut-off when the switching signal cuts off the first transistor.

15. A switching circuit as claimed in claim 14 further comprising inductor means connected in series circuit with said switching signal applying means and the base-emitter junction of the first transistor for limiting the variation in reverse base current flow when the switching signal drives the first transistor into cut-off.

16. A switching circuit as claimed in claim 11 further comprising inductor means connected in series circuit with said switching signal applying means and the base-emitter junction of the transistor for limiting the variation in reverse base current flow when the switching signal drives the transistor into cut-off.

17. A switching circuit as claimed in claim 12 wherein said impedance element comprises a saturable reactor that is driven into saturation by said reverse current flow and is unsaturated during a portion of the time that the switching signal cuts off the transistor thereby to provide said 1 microsecond time delay, and inductor means connected in series circuit with said switching signal applying means and the base-emitter junction of the transistor for limiting the variation in reverse base current flow when the switching signal drives the transistor into cut-off.

* * * * *

-1050
/69)

UNITED STATES PATENT OFFICE
CERTIFICATE OF CORRECTION tent No. 3,840,755 Dated Oct. 8, 1974 ventor(s) GÜNTER BENNER

It is certified that error appears in the above-identified patent id that said Letters Patent are hereby corrected as shown below:

IN THE TITLE PAGE below "Foreign Application Priority Data" changè "2151610" to -- P.2151610.9 --; Change "2217451" to -- P.2217451.2 --;

Signed and sealed this 10th day of December 1974.

(SEAL)
Attest:

McCOY M. GIBSON JR.
Attesting Officer

C. MARSHALL DANN
Commissioner of Patents